(12) United States Patent
Martin et al.

(10) Patent No.: US 7,494,041 B2
(45) Date of Patent: Feb. 24, 2009

(54) IN-SITU ALLOYED SOLDERS, ARTICLES MADE THEREBY, AND PROCESSES OF MAKING SAME

(75) Inventors: Edward L. Martin, Chandler, AZ (US); Tiffany A. Byrne, Chandler, AZ (US); Carl Deppisch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 304 days.

(21) Appl. No.: 10/874,843

(22) Filed: Jun. 23, 2004

(65) Prior Publication Data

US 2005/0284918 A1    Dec. 29, 2005

(51) Int. Cl.
*B23K 31/02* (2006.01)
*H01L 21/44* (2006.01)

(52) U.S. Cl. .............. 228/180.22; 228/248.1; 438/613

(58) Field of Classification Search .............. None
See application file for complete search history.

(56) References Cited

U.S. PATENT DOCUMENTS

| 5,320,272 | A | * | 6/1994 | Melton et al. ......... 228/180.21 |
| 5,714,735 | A | * | 2/1998 | Offer ................... 219/136 |
| 6,086,683 | A | * | 7/2000 | Toki et al. ............. 148/24 |
| 6,174,462 | B1 | * | 1/2001 | Oka et al. .............. 252/514 |
| 6,214,131 | B1 | * | 4/2001 | Hua ..................... 148/24 |
| 6,613,123 | B2 | * | 9/2003 | Corbin et al. ........... 75/255 |
| 6,638,847 | B1 | * | 10/2003 | Cheung et al. .......... 438/612 |
| 6,896,172 | B2 | * | 5/2005 | Taguchi et al. ......... 228/180.1 |
| 7,241,348 | B2 | * | 7/2007 | Wada et al. ............ 148/24 |
| 2002/0102432 | A1 | * | 8/2002 | Ochiai et al. .......... 428/671 |
| 2003/0168123 | A1 | * | 9/2003 | Wada et al. ............ 148/23 |
| 2003/0176054 | A1 | * | 9/2003 | Huebner et al. ......... 438/612 |
| 2004/0177997 | A1 | * | 9/2004 | Hata et al. ............. 174/257 |

FOREIGN PATENT DOCUMENTS

EP    0867255 A2 *  9/1998

* cited by examiner

*Primary Examiner*—Kiley Stoner
(74) *Attorney, Agent, or Firm*—John N. Greaves (57) ABSTRACT

A composition includes a solder paste matrix and a solder mixture including a tin-based solder alloy. The composition also includes a discrete dispersion of a metal. The tin-based alloy includes a melting first temperature and the metal includes a melting second temperature. The melting second temperature is greater than the melting first temperature. The discrete dispersion is in a particle range of a majority passing minus 520-mesh. A process includes blending the solder mixture and the metal under non-alloying conditions to achieve the discrete dispersion of the metal. A process includes reflowing the composition such that the composition when solidified, has a melting point that is higher than the solder mixture in the composition.

15 Claims, 8 Drawing Sheets

IN-SITU ALLOYED SOLDERS, ARTICLES MADE THEREBY, AND PROCESSES OF MAKING SAME

BACKGROUND INFORMATION

1. Technical Field

Embodiments relate to solder for bonding microelectronic devices. In particular, an embodiment relates to a solder paste that includes in situ alloying components that form an alloy during assembly reflow.

2. Description of Related Art

Where a microelectronic device is sensitive to conventional oven reflow temperatures, which are about 200° to 220° C., reflow of electrical bumps needs to occur at temperatures less than about 125° C. The operating temperature range of a microelectronic device, however, can be in the range from about 50° to about 80° C. Such a device requires the solder to have a higher liquidus temperature to reduce thermally accelerated solder joint reliability failure modes such as creep and fatigue that can occur at the ordinary operating temperature range of the device. Multiple solder bump reflows and burn-in testing can make solder joint failure and device failure more likely.

One approach to the temperature sensitivity of solders is to use solder alloys such as tin-antimony, tin-lead, and tin-indium. These solders, however, are also susceptible to thermally accelerated solder joint reliability failures such as creep and fatigue. One board mounting process with conventional solders requires at least two solder bump reflows. They include a ball attach first reflow and a board attach second reflow.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

The following description includes terms, such as upper, lower, first, second, etc. that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A board is typically a resin-impregnated fiberglass structure that acts as a mounting substrate for the die. A die is usually singulated from a wafer, and wafers may be made of semiconducting, non-semiconducting, or combinations of semiconducting and non-semiconducting materials.

Reference will now be made to the drawings wherein like structures may be provided with like reference designations. In order to show the structures of embodiments most clearly, the drawings included herein are diagrammatic representations of inventive articles. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1:
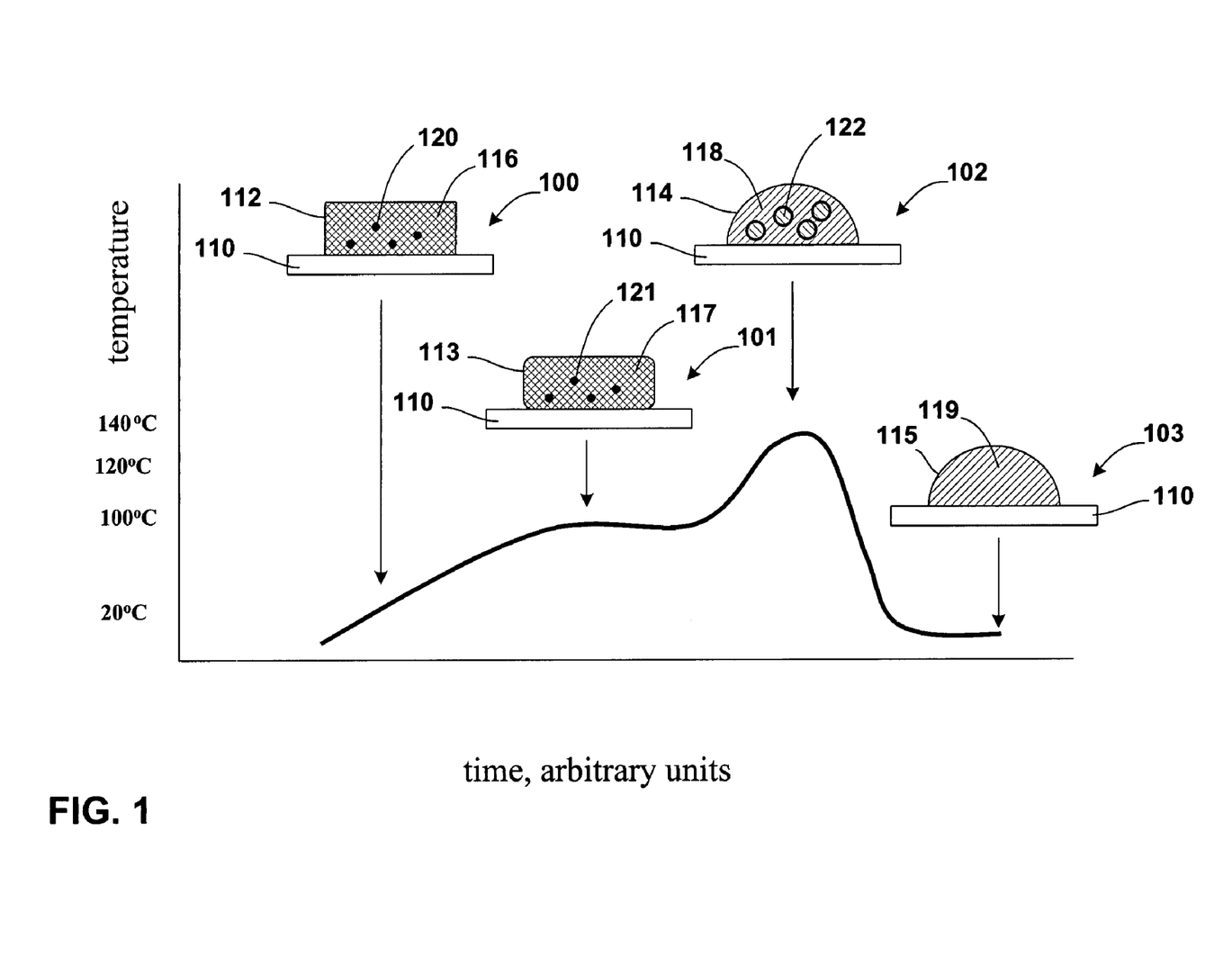
FIG. 1 is a process flow depiction of a solder paste mixture according to an embodiment.

FIG. 1 is a process flow depiction of a solder paste mixture according to an embodiment. The process flow is illustrated against a temperature-versus-time graphic to illustrate the state of the solder paste during processing. According to a process embodiment, the graphic ordinate depicts a room temperature of 20° C., a first ramp temperature of about 100° C., a flux activation temperature of about 120° C., a solder in situ alloying temperature of about 140° C., and a cooled solder temperature of 20° C. The abscissa depicts process time in arbitrary units.

In an embodiment, a process unit 100 includes a substrate 110 and a solder paste brick 112. Within the solder paste brick 112 is a solder paste matrix 116, which includes a solder mixture (not depicted). In an embodiment, the solder mixture includes an alloy of a first metal and a second metal. In an embodiment, the first metal includes tin and the second metal includes bismuth. In an embodiment, the first metal includes tin and the second metal includes indium. Other solder mixtures can be used such as lead-based solders, tin-silver solders, tin-gold solders, tin-copper solders and others. The solder paste brick 112 also includes a discrete dispersion of a third metal 120. The third metal 120 is depicted within the solder paste brick 112 as four discrete particles for the purposes of illustration. In an embodiment, the third metal 120 includes gold, gold alloys, and the like. In an embodiment, the third metal 120 includes silver, silver alloys, and the like. In an embodiment, the third metal 120 includes copper, copper alloys, and the like. In an embodiment, the third metal 120 includes a combination of at least two of gold, silver, and copper. In an embodiment, the third metal 120 includes all three of gold, silver, and copper.

In an embodiment, processing conditions sufficient for in situ alloying are carried out. During processing, the solder paste brick 112 is heated during a ramp-up stage from room temperature to about 100° C. During further heating, the solder paste flux begins to activate. According to an embodiment, the process unit 101 is depicted as relating to the temperature of about 100° C. At about this temperature, the flux in the solder paste brick 113 begins to activate. The solder paste brick 113 is depicted with softening corners during flux activation. The solder paste matrix 117 is changing chemically during this process as the flux is activating and the solder mixture begins to soften. According to an embodiment, the discrete dispersion of the third metal 121 is not substantially melted into the solder mixture.

According to an embodiment, the process unit 102 is depicted as relating to the temperatures from about 120° C. to about 140° C. during the heating portion of the reflow process. At about this temperature range, the flux in the solder paste brick 114 has activated and the solder mixture in the solder paste matrix 118 is melted. The solder paste brick 114 is depicted with a substantially rounded profile. Additionally, the third metal 122 is depicted as dispersing within the solder matrix 118 during the in situ alloying of the third metal 122 into the solder mixture.

According to an embodiment, the process unit 103 is depicted as relating to the temperatures from about 140° C. to about 20° C. during cool-down of the unit. At about this temperature range, the flux in the solder bump 115 has been substantially driven from the matrix 119. The solder bump 115 is depicted with a substantially rounded profile. Additionally, the third metal is depicted as substantially dispersed and alloyed into the matrix 119.

In an embodiment, preparation of the solder paste brick 112 is carried out by a non-alloying blending of components of the solder paste matrix 116. In an embodiment, the blending process is carried out in a conventional kneading device.

In an embodiment, a 42Sn58Bi solder paste is blended with solder flux and a dispersion of a pure metal. By "pure metal", it is meant that the pure metal is a substantially mono-element metal as can be obtained commercially for use in the microelectronics industry. The term "pure metal", however, also can mean an alloy that is nevertheless discretely dispersed in the matrix with the solder paste before reflow. In this embodiment, the pure metal is gold powder that is about 100% minus 300-mesh, 90% passing minus 520-mesh on the Tyler mesh scale. In this embodiment, the pure metal is in a concentration range from about 0.5% to about 50%. During blending of the composition of the solder mixture, the paste including flux, and the pure metal, no significant mechanical or chemical alloying occurs between the solder mixture and the pure metal.

In an embodiment, the 42Sn58Bi solder paste is blended with solder flux and a dispersion of the pure metal. In this embodiment, the pure metal is silver powder that is about 100% minus 300-mesh, 90% passing minus 520-mesh on the Tyler mesh scale. In this embodiment, the pure metal is in a concentration range from about 0.5% to about 50%.

In an embodiment, the 42Sn58Bi solder paste is blended with solder flux and a dispersion of the pure metal. In this embodiment, the pure metal is copper powder that is about 100% minus 300-mesh, 90% passing minus 520-mesh on the Tyler mesh scale. In this embodiment, the pure metal is in a concentration range from about 0.5% to about 50%.

In an embodiment, a 48Sn52In solder paste is blended with solder flux and a dispersion of a pure metal. In this embodiment, the pure metal is gold powder that is about 100% minus 300-mesh, 90% passing minus 520-mesh on the Tyler mesh scale. In this embodiment, the pure metal is in a concentration range from about 0.5% to about 50%.

In an embodiment, the 48Sn52In solder paste is blended with solder flux and a dispersion of the pure metal. In this embodiment, the pure metal is silver powder that is about 100% minus 300-mesh, 90% passing minus 520-mesh on the Tyler mesh scale. In this embodiment, the pure metal is in a concentration range from about 0.5% to about 50%.

In an embodiment, the 48Sn52In solder paste is blended with solder flux and a dispersion of the pure metal. In this embodiment, the pure metal is copper powder that is about 100% minus 300-mesh, 90% passing minus 520-mesh on the Tyler mesh scale. In this embodiment, the pure metal is in a concentration range from about 0.5% to about 50%.

As depicted in FIG. 1, after the pure metal powder particles of the third metal are discretely dispersed into the solder paste, the solder paste is printed via an automated stencil print process and takes the form of the brick 112. As set forth herein, flux in the solder paste reacts chemically at increasing temperatures to release acids that reduce metal-oxides that are present. As the temperature reaches and surpasses the liquidus temperature of the solder mixture, the powder particles of the third metal in the solder paste liquefy and alloy with the first and second components of the solder mixture in situ. As depicted with the process unit 102, the matrix 118 coalesces and takes the form of a hemisphere. Simultaneously, the matrix 118 reacts chemically with under-bump metallization (not pictured) in the substrate 110 to form a metallic bond. Additionally, the powder of the pure third metal diffuses into the molten solder although the liquidus temperature of the pure metal powder may not be reached. Upon cooling, the solder bump 115 solidifies at a temperature that is higher than the liquidus temperature of the solder mixture that is depicted as part of the solder paste brick 112.

According to an embodiment, were the solder bump 115 to be reheated, the in situ-formed solder alloy would liquefy at the higher temperature than it did upon its first reflow due to a change in composition from the in situ alloying process.

Figure 2:
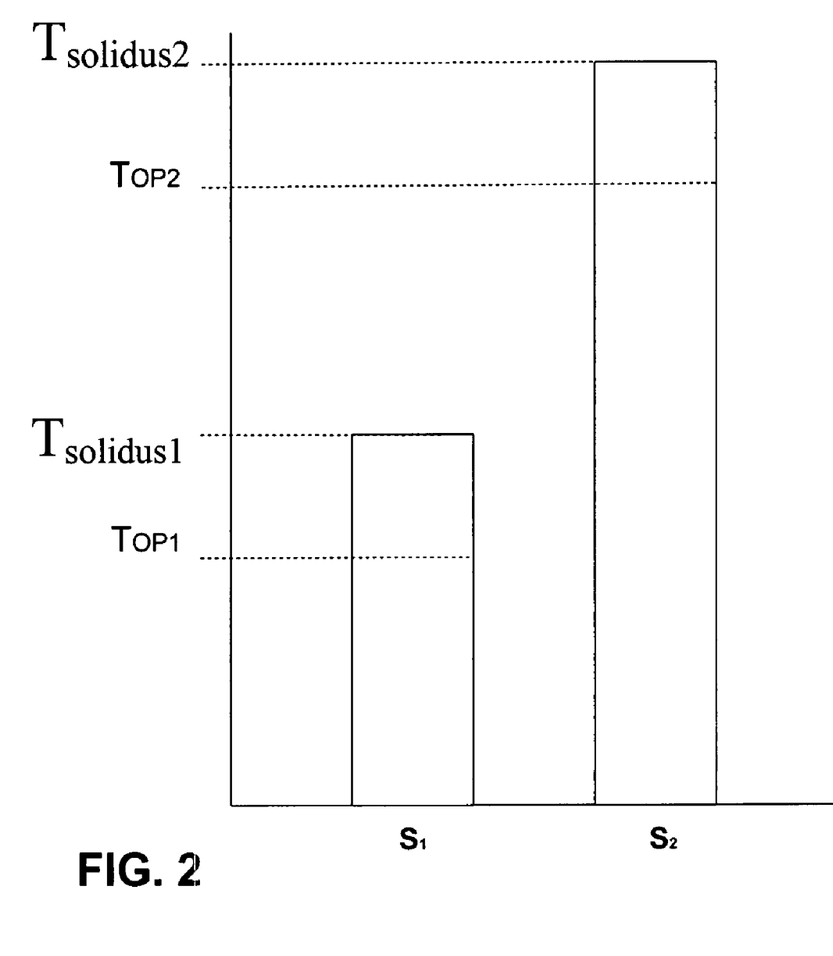
FIG. 2 is a comparison of a conventional solder in relation to the maximum operating temperature range of a microelectronic device, and a solder embodiment.

FIG. 2 is a comparison of a conventional solder in relation to the maximum operating temperature range of a microelectronic device, and a solder embodiment. The graphic depicts a solder-1 ($S_1$), a conventional solder, and a solder-2 ($S_2$) a solder according to an embodiment. In FIG. 2, $S_1$ has a useful maximum operating temperature ($T_{OP1}$) and a solidus temperature ($T_{solidus1}$). In an embodiment, $S_2$ has a useful maximum operating temperature ($T_{OP2}$) that is higher than $T_{OP1}$.

Additionally, the $T_{OP2}$ range includes all of the $T_{OP1}$ range, plus a significant amount (depicted qualitatively) that is higher than $T_{OP1}$. Similarly, $S_2$ includes a solidus temperature ($T_{solidus2}$) that is significantly higher than the $T_{solidus1}$ of the conventional solder.

In an embodiment, a eutectic SnCu powder, 90%, is blended with pure Cu, 10%. In an embodiment, the eutectic SNCu power includes a composition of about 99.3% Sn and about 0.7% Cu. After in situ alloying, the liquidus temperature of the mixture has changed from about 227° C. to about 430° C.

Although some solders can be configured to have an operating temperature similar to $T_{OP2}$ and a solidus temperature similar to $T_{solidus2}$, reflow processing according to an embodiment to achieve the solder bump 115 is carried out at a lower temperature range due to the in situ alloying process set forth in this disclosure. This lower temperature range can be within the thermal budget of the microelectronic device fabrication and assembly process.

Figure 3A:
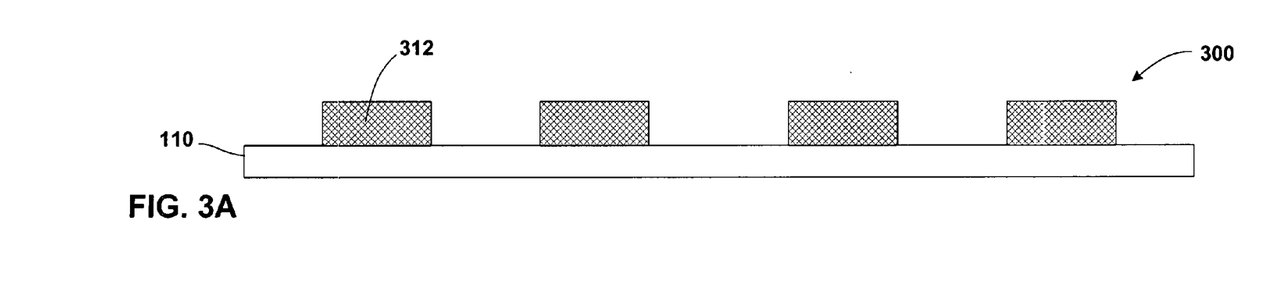
FIG. 3A is a cross-sectional elevation of a package during assembly according to an embodiment.

FIG. 3A is a cross-sectional elevation of a package 300 during assembly according to an embodiment. The package 300 includes a mounting substrate 310 and a plurality of solder paste bricks, one of which is indicated by the reference numeral 312. According to an embodiment, the solder paste brick 312 is formed by kneading solder paste, flux, a solder mixture of tin-indium and/or tin-bismuth, with a pure metal as set forth in this disclosure such that no significant chemical or mechanical blending occurs between the solder mixture and the pure metal. The solder paste brick 312 is patterned on the mounting substrate 310 by a technique such as screen or stencil printing.

Figure 3B:
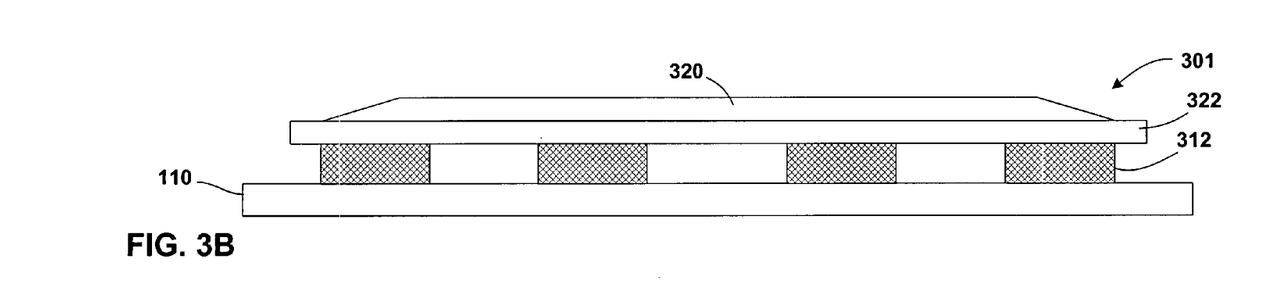
FIG. 3B is a cross-sectional elevation of the package depicted in FIG. 3A after further processing according to an embodiment.

FIG. 3B is a cross-sectional elevation of the package 300 depicted in FIG. 3A after further processing according to an embodiment. The package 301 has been augmented by the addition of an encapsulated die 320 on a second-level substrate 322. The second-level substrate 322 is registered, aligned, and placed upon the plurality of solder paste bricks 312.

Figure 3C:
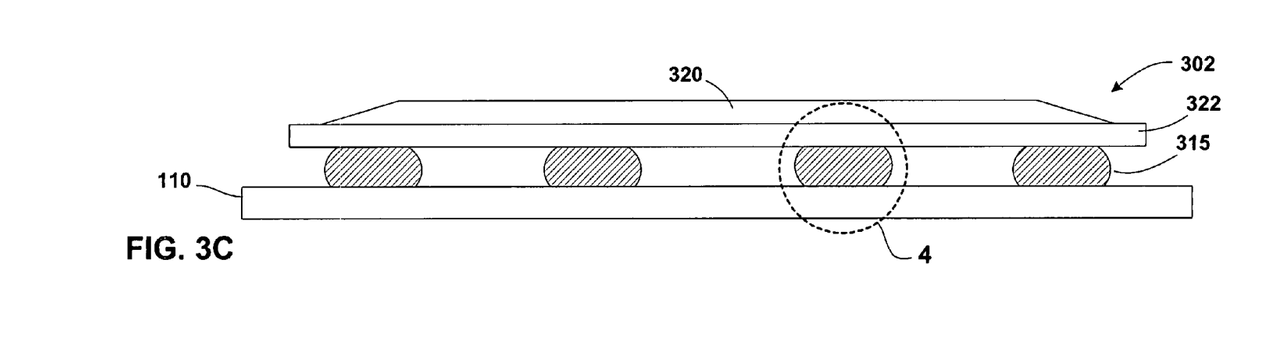
FIG. 3C is a cross-sectional elevation of the package depicted in FIG. 3B after further processing according to an embodiment.

FIG. 3C is a cross-sectional elevation of the package 301 depicted in FIG. 3B after further processing according to an embodiment. The package 302 has been further processed by reflowing of the solder paste bricks 312 into solder bumps, one of which is indicated by the reference numeral 315. During reflow of the solder paste bricks 312 (FIG. 3B), the process of in situ alloying of the at least one pure metal into the solder mixture is carried out.

Figure 4:
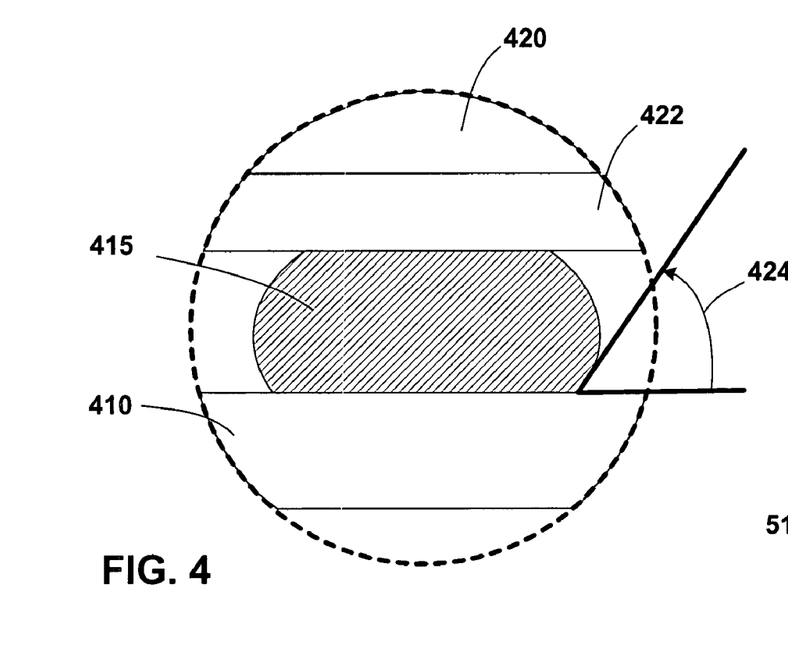
FIG. 4 is a detail section of an electrical bump in a package, taken from the section line in FIG. 3C according to an embodiment.

FIG. 4 is a detail section of an electrical bump in a package, taken from the section line in FIG. 3C according to an embodiment. The section line 4 in FIG. 3C depicts a portion of the package. The package in FIG. 4 includes a mounting substrate 410 and a solder bump 415 that has been reflowed and in situ alloyed according to an embodiment. The solder bump 415 is depicted between a second-level substrate 422 and the mounting substrate 410. Additionally, a portion of an encapsulated die 420 is depicted.

In an embodiment, the combination of the materials of the solder bump 415, the second-level substrate 422, and the mounting substrate 410, along with processing conditions, results in a solder bump wetting contact angle 424 that is an acute angle.

Figure 5:
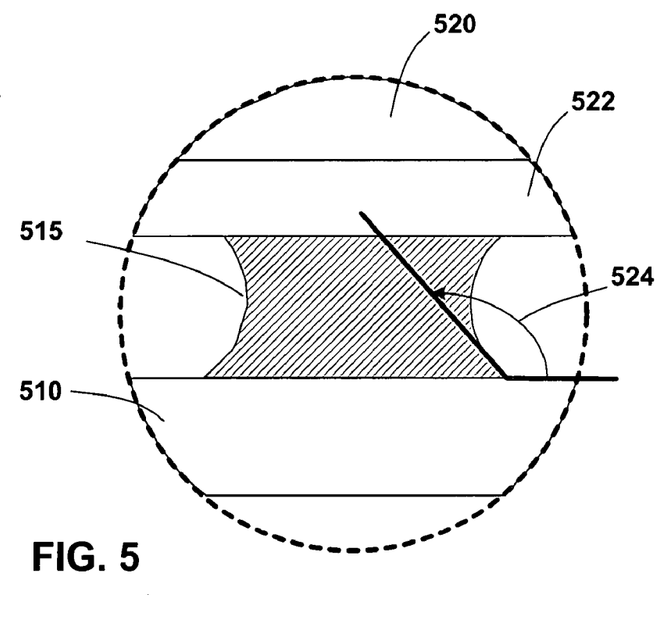
FIG. 5 is a detail section of an electrical bump in a package, taken from the section line in FIG. 3C according to an embodiment.

FIG. 5 is a detail section of an electrical bump in a package, taken from the section line in FIG. 3C according to an embodiment. The section line a in FIG. 3C depicts a portion of the package. The package in FIG. 5 includes a mounting substrate 510 and a solder bump 515 that has been reflowed and in situ alloyed according to an embodiment. The solder bump 515 is depicted between a second-level substrate 522 and the mounting substrate 510. Additionally, a portion of an encapsulated die 520 is depicted.

In an embodiment, the combination of the materials of the solder bump 515, the second-level substrate 522, and the mounting substrate 510, along with processing conditions, results in a solder bump wetting contact angle 524 that is an obtuse angle.

In an embodiment, the solder bump wetting contact angle is substantially orthogonal with the plane of the second level substrate and the mounting substrate, or one of them.

Figure 6:
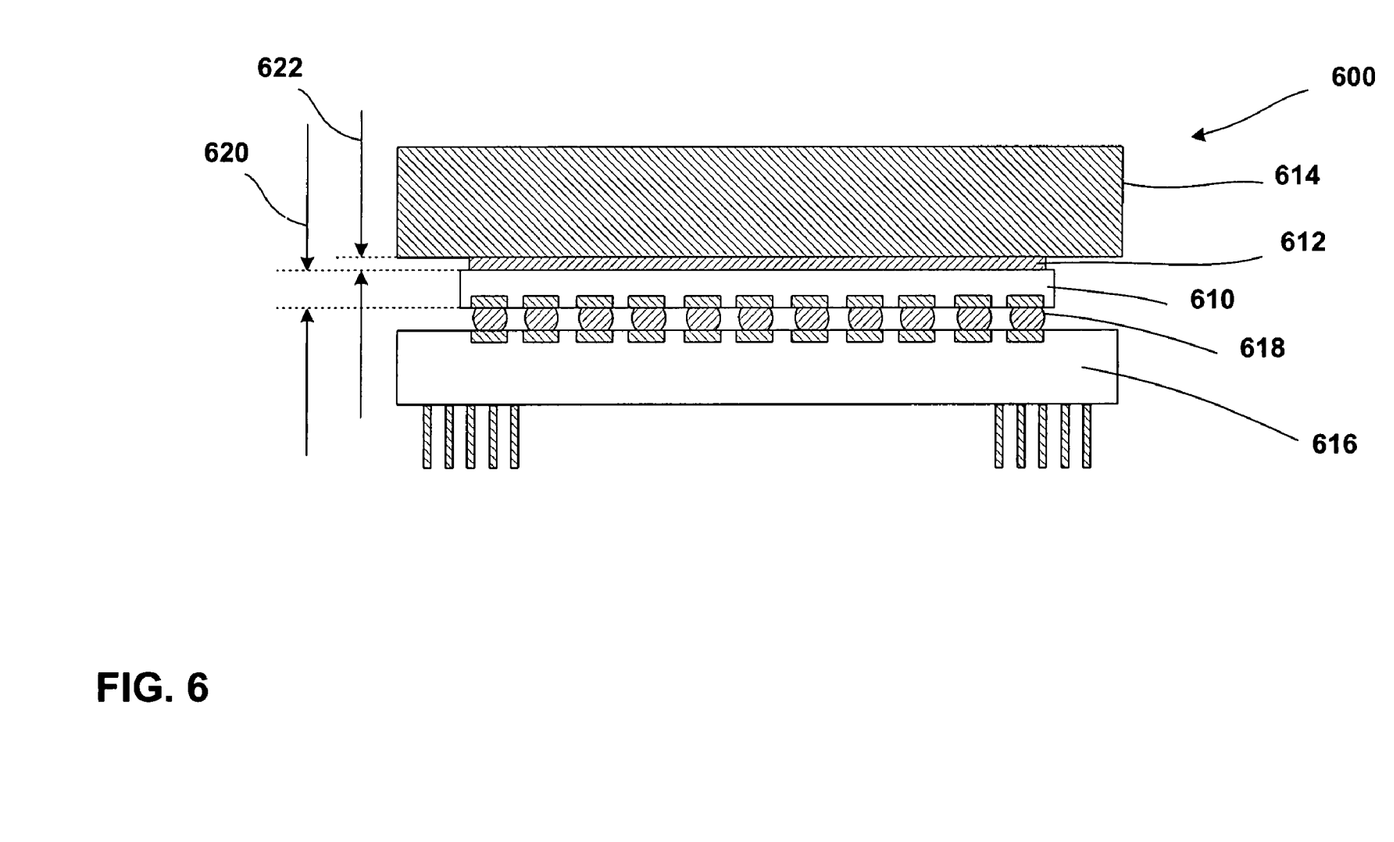
FIG. 6 is a cross-sectional elevation of a chip package according to an embodiment.

FIG. 6 is a cross-sectional elevation of a chip package 600 according to an embodiment. A die 610 is depicted bonded with a thermal interface material (TIM) 612 to a heat sink 614, and at the active surface of the die 610, to a substrate 616 such as an organic interposer. The die 610 is coupled to the substrate 616 through a series of in situ-alloyed electrical bumps 618, one of which is designated.

In an embodiment, the die 610 has a thickness 620 in a range from about 50 micrometer ($\mu$m) to about 150 $\mu$m. In an embodiment, the die 610 has a thickness 120 in a range from about 80 $\mu$m to about 120 $\mu$m. In an embodiment, the die 610 has a thickness 120 of about 100 $\mu$m. In an embodiment, the die 610 has a thickness 120 of no more than about 100 $\mu$m. In an embodiment, the die 610 has a thickness 120 of less than about 100 $\mu$m.

In an embodiment in addition to the in situ-alloyed electrical bumps 618, the TIM 612 is an in situ-alloyed material. In an embodiment, the TIM 612 has a bond-line thickness (BLT) 622 in a range from about 0.1 $\mu$m to about 50 $\mu$m. In an embodiment, the TIM 612 has a BLT 622 of about 6 $\mu$m.

FIG. 6 also illustrates the heat sink 614 used to fabricate an integrated circuit package 600 in accordance with various embodiments. The heat sink 614 includes a substantially planar (flat), highly thermally conductive material to remove the power dissipated in the die 610.

In an embodiment, the material used to fabricate the heat sink 114 includes a metal such as copper, copper alloys including copper alloys with tungsten, copper laminates, cladded copper structures, combinations thereof, and the like. In an embodiment, the material used to fabricate the heat sink 614 includes molybdenum, molybdenum laminates, molybdenum alloys, cladded molybdenum structures, combinations thereof, and the like. In an embodiment, the material used to fabricate the heat sink 114 includes aluminum, aluminum alloys including metallized aluminum nitride, cladded aluminum structures, combinations thereof, and the like. The aluminum nitride may be metallized with chromium/gold, titanium/gold, or nickel/gold films. In an embodiment, the material used to fabricate the heat sink 614 includes beryllium oxide and the like. In an embodiment, the material used to fabricate the heat sink 614 includes carbon fibers, graphite, diamond, combinations thereof, combinations thereof, and the like. In an embodiment, the material used to fabricate the heat sink 614 includes, but is not limited to, thermally conductive ceramic materials, such as AlSiC, AlN, and the like.

Figure 7:
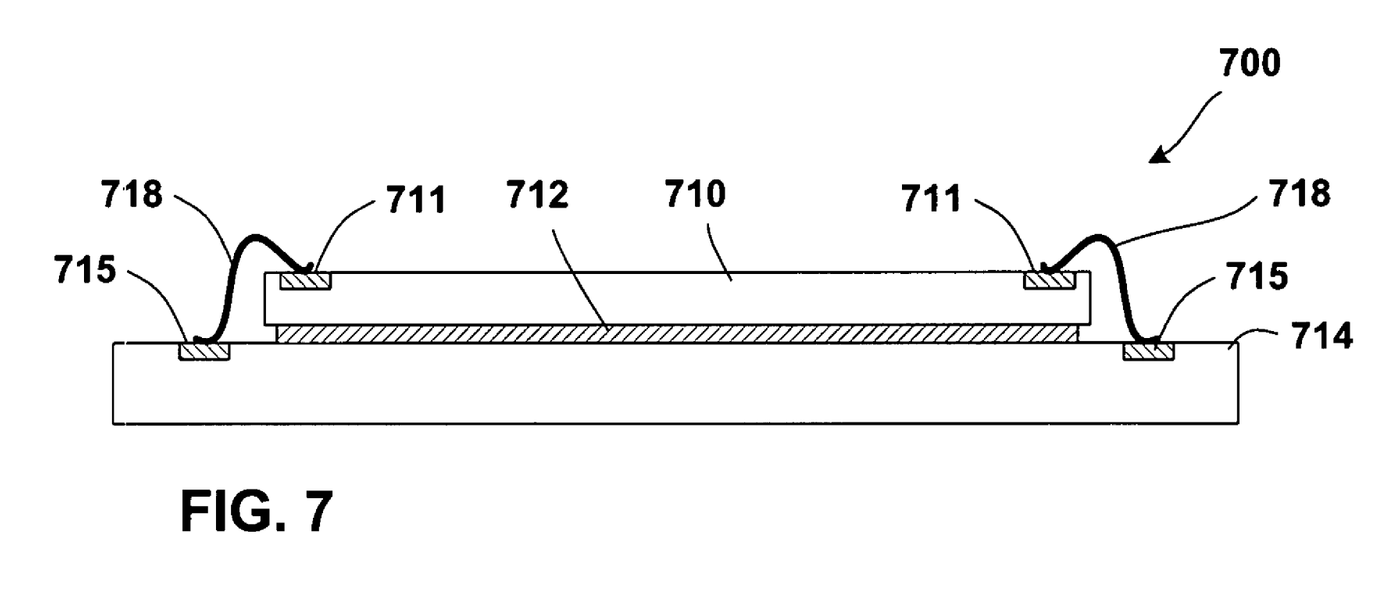
FIG. 7 is a cross-sectional elevation of a chip package according to an embodiment.

FIG. 7 is a cross-sectional elevation of a chip package 700 according to an embodiment. A die 710 is depicted bonded with a TIM 712 to a heat sink 714 that is also the mounting substrate such as an organic board made of metal-laminated fiber glass. In an embodiment, the TIM 712 includes an in situ-alloyed material as set forth in this disclosure.

The active surface of the die 710 is coupled to the heat sink/substrate 714 through a series of wire bonds 718. In an embodiment, the joints of the wire bonds 718 coupled at the die 710 and at the heat sink/substrate 714 at the respective bond pads 711 and 715, are prepared with a solder paste that includes the solder mixture and the pure metal in a discrete dispersion as set forth in this disclosure. During wire bonding, the solder paste reflows and forms an in situ-alloyed wire bond joint at 711 and 715, respectively. In an embodiment, application of the chip package 700 is to a portable device such as a hand-held or a notebook computer.

Figure 8:
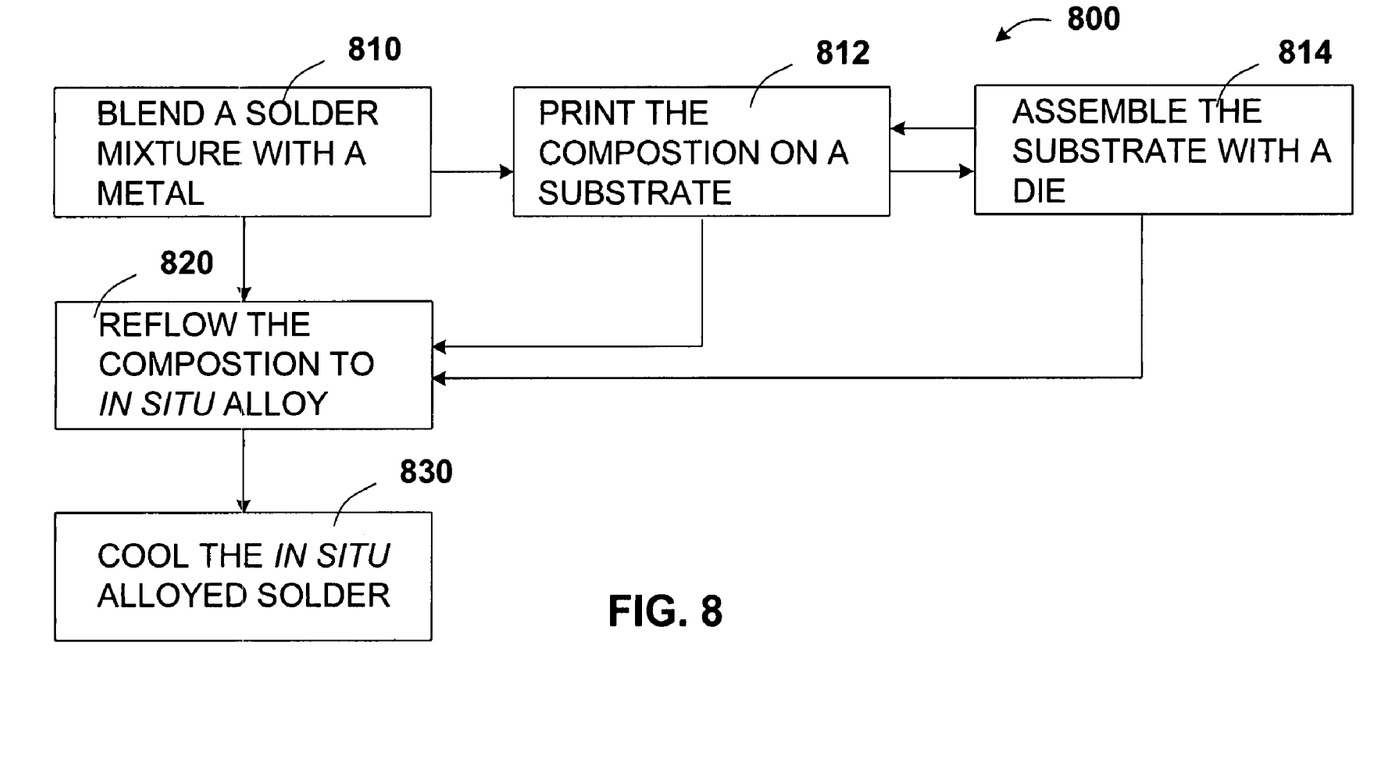
FIG. 8 is a process flow diagram according to an embodiment.

FIG. 8 is a process flow diagram 800 according to an embodiment.

At 810, the process includes blending a solder mixture with a solder paste and a pure metal. By way of non-limiting example, a solder paste is kneaded with a tin-bismuth solder mixture and a pure metal. A 42Sn58Bi solder paste is blended with solder flux and a dispersion a pure metal is gold powder that is about 100% minus 300-mesh, 90% passing minus 520-mesh on the Tyler mesh scale. In this embodiment, the pure metal is in a concentration range from about 0.5% to about 50%. In an embodiment, the process includes substantially non-alloying, whether mechanical and/or chemical, of the pure metal with the solder mixture. Accordingly a discrete dispersion of the pure metal is achieved in a matrix of solder paste. In an embodiment a process is completed at 810.

At 812, a process further includes printing a solder paste brick on a substrate. By way of non-limiting example, the solder paste brick 312 is printed on the mounting substrate 310 (FIG. 3A). In an embodiment a process is completed at 812.

At 814, a process further includes assembling a chip package such as a solder paste brick between two surfaces. In a non-limiting example, an encapsulated die 320 on a second-level substrate 322 is registered, aligned, and placed upon the plurality of solder paste bricks 312.

At 820, the process includes reflowing the solder paste brick. During reflow, the solder mixture and the pure metal experience an in situ alloying process. By way of non-limiting example, the package 303 (FIG. 3C) has experienced reflowing of the solder paste bricks 312 into solder bumps 315.

At 830, the process includes cooling of the in situ-alloyed solder. According to an embodiment, the in situ-alloyed solder includes a $T_{solidus}$ that is higher than the $T_{solidus}$ of the solder mixture that existed in the solder paste brick embodiment.

Figure 9:
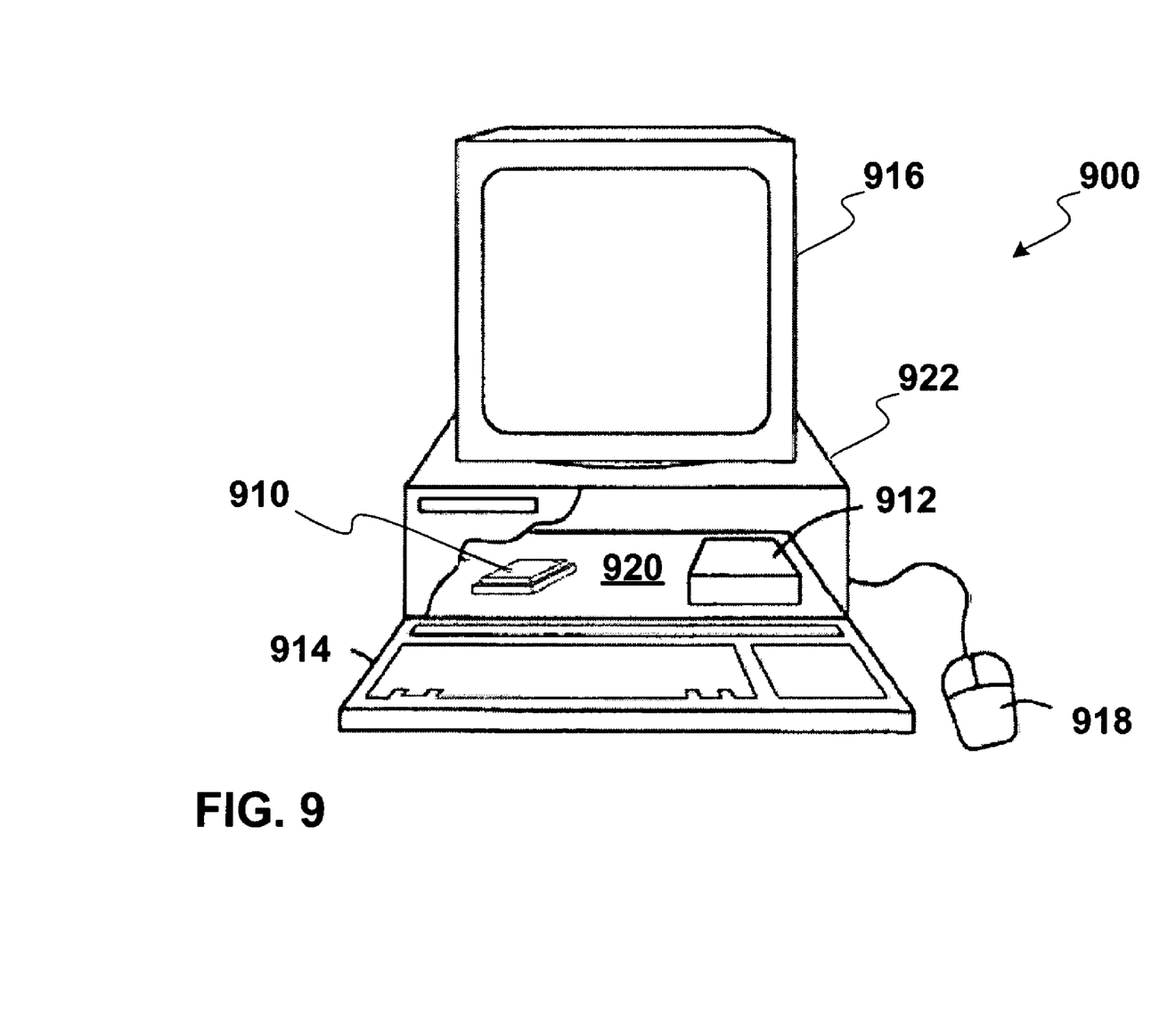
FIG. 9 is a depiction of a computing system according to an embodiment.

FIG. 9 is a depiction of a computing system according to an embodiment. The computing system 900 includes a solder bump such as the in situ-alloyed solder 315 (FIG. 3C). Hereinafter, where the computing system 900 refers to a microelectronic device that is coupled to an in situ-alloyed solder, is understood to include an in situ-alloyed solder according to the various embodiments set forth in this disclosure. One or more of the foregoing embodiments of the in situ-alloyed solder may be utilized in a computing system, such as a computing system 900 of FIG. 9. Similarly, the computing system can include a die, an in situ-alloyed solder, an in situ-alloyed TIM, and a heat sink according to any of the article embodiments set forth in this disclosure.

In an embodiment, the computing system 900 includes at least one processor (not pictured), which is enclosed in a package 910, a data storage system 912, at least one input device such as keyboard 914, and at least one output device such as monitor 916, for example. The computing system 900 includes a processor that processes data signals, and may include, for example, a microprocessor, available from Intel Corporation. In addition to the keyboard 914, the computing system 900 can include another user input device such as a mouse 918, for example. Additionally, the computing system 900 includes a housing 922. As depicted, the housing 922 is a shell for a desktop computer. Other housing embodiments are applicable depending upon the specific computing system.

For purposes of this disclosure, a computing system 900 embodying components in accordance with the claimed subject matter may include any system that utilizes a microelectronic device system, which may include for example, an in situ-alloyed solder configuration that is coupled to data storage such as dynamic random access memory (DRAM), polymer memory, flash memory, and phase-change memory. In this embodiment, the in situ-alloyed solder configuration is coupled to any combination of these functionalities by being coupled to an input-output device. In an embodiment, however, an in situ-alloyed solder configuration set forth in this disclosure is coupled to any of these functionalities. For an example embodiment, data storage includes an embedded DRAM cache on a substrate that is coupled to an in situ-alloyed solder. Additionally in an embodiment, the in situ-alloyed solder configuration is part of the system with an in situ-alloyed solder configuration that is coupled to the data storage of the DRAM cache. Additionally in an embodiment an in situ-alloyed solder configuration is coupled to the data storage 912.

In an embodiment, the computing system 900 can also include an in situ-alloyed solder that is coupled to a digital signal processor (DSP), a micro controller, an application specific integrated circuit (ASIC), or a microprocessor. In this embodiment, the in situ-alloyed solder configuration is coupled to any combination of these functionalities by being coupled to a motherboard or the like. For an example embodiment, a DSP (not pictured) is part of a chipset that may include a stand-alone die processor (in package 910) and the DSP as separate parts of the chipset. In this embodiment, an in situ-alloyed solder configuration is coupled to the DSP, and a separate in situ-alloyed solder configuration may be present that is coupled to the processor in package 910. Additionally in an embodiment, an in situ-alloyed solder configuration is coupled to a DSP that is mounted on the same board 920 as the package 910.

In a process embodiment, a single-reflow process is carried out where a chip package such as is depicted in FIGS. 3A to 3C is the package 910 depicted in FIG. 9. In FIG. 9, the package 910 is depicted as mounted upon the board 920. According to a single-reflow process embodiment, mounting the package 910 upon the board 920 is carried out by using at least one embodiment of the in situ-alloyed solder configuration for at least one of mounting the package 910 on the board, and for mounting, e.g., the chip package 302 on the substrate 310, which is inside the package 910.

It can now be appreciated that embodiments set forth in this disclosure can be applied to devices and apparatuses other than a traditional computer. For example, a die can be packaged with an embodiment of the in situ-alloyed solder configuration, and placed in a portable device such as a wireless communicator or a hand-held device such as a personal data assistant and the like. Another example is an in situ-alloyed solder that can be packaged as an embodiment and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:
1. A process comprising:
 kneading a solder alloy paste including a first metal and a second metal with a third metal under non-alloying conditions to form a composition;
 melting the solder composition at a first temperature under conditions of in situ alloying of components in the composition to form a bump, wherein the solder composition includes tin-containing solder first and second components, selected from a tin-bismuth solder, a tin-indium solder, and mixtures thereof, and the metal third component, selected from gold, copper, silver, and mixtures thereof, the process including in situ alloying of the metal third component into the solder first and second components; and solidifying the bump at a second temperature that is greater than the first temperature.

2. A process comprising:

kneading a solder alloy paste including a first metal and a second metal with a third metal under non-alloying conditions to form a composition;

melting the solder composition at a first temperature under conditions of in situ alloying of components in the composition to form a bump, wherein the solder composition includes tin-containing solder first and second components and the metal third component, wherein the tin-containing solder first and second components are selected from a 42Sn58Bi, 48Sn52In, and mixtures thereof and the metal third component is selected from Au, Cu, Ag, and mixtures thereof, the process including in situ alloying of the metal third component into the solder first and second components.

3. The process of claim 1, wherein the metal third component has a Tyler-mesh size of about minus 520-mesh, the process further including blending the tin-containing solder first and second components and the metal third component.

4. The process of claim 1, wherein the tin-containing solder first and second components include a first melting point, wherein the metal third component includes a second melting point, and wherein the first melting point is lower than the second melting point, the process further including blending the tin-containing solder first and second components and the metal third component.

5. The process of claim 1, further including:

forming the composition upon a substrate; and wherein melting the solder composition includes reflow processing the composition.

6. A process comprising:

kneading a solder alloy paste including a first metal and a second metal with a metal third component under non-alloying conditions to form a composition, wherein the composition includes:

tin-containing solder first and second components, selected from a tin-bismuth solder, a tin-indium solder, and mixtures thereof; and the metal third component, selected from gold, copper, silver, and mixtures thereof, wherein the solder alloy paste includes a solder alloy first melting point, and wherein the metal includes a metal second melting point that is greater than the first melting point; and reflowing the composition under conditions of in situ alloying of the composition.

7. The process of claim 6, following reflowing, the process including solidifying the composition at a composition temperature that is greater than the first melting point.

8. The process of claim 6, the process including the in situ alloying of the metal third component into the solder first and second components beginning at a first melting point, the process further including:

solidifying into a composition at a composition temperature that is greater than the first melting point.

9. The process of claim 6, wherein the composition includes:

tin-containing solder first and second components, selected from a 42Sn58Bi, 48Sn52In, and mixtures thereof; and solidifying into a composition at a composition temperature that is greater than the first melting point.

10. The process of claim 6, further including:

forming the composition upon a substrate; and wherein reflowing the composition under conditions of in situ alloying of the composition includes forming and solidifying an electrical bump that exhibits a melting point that is greater than the first melting point.

11. A process comprising:

kneading a fluxed solder alloy paste including a first metal and a second metal with a metal third component under non-alloying conditions to form a composition;

melting the tin-containing solder composition at a first temperature under conditions of in situ alloying of components in the composition to form a bump, wherein the solder composition includes tin-containing solder first and second components and the metal third component, wherein the tin-containing solder first and second components are selected from a tin-bismuth solder, a tin-indium solder, and mixtures thereof, wherein the tin-containing solder first and second components include a first melting point, wherein the metal third component includes a second melting point, wherein the first melting point is lower than the second melting point; and solidifying the bump at a second temperature that is greater than the first temperature.

12. The process of claim 11, wherein the metal third component is selected from Au, Cu, Ag, and mixtures thereof, the process including in situ alloying of the metal third component into the solder first and second components.

13. The process of claim 11, wherein in situ alloying forms a bump.

14. The process of claim 11, wherein kneading the metal third component comprises forming a discrete dispersion of a metal that is present as a total mass of the fluxed solder paste composition, from about 0.5% to about 50%.

15. The process of claim 11, wherein the tin-containing solder mixture is selected from tin-bismuth, tin-indium, 42Sn58Bi, 48Sn52In, and mixtures thereof, and wherein the metal third component comprises a discrete dispersion of a metal that is present as a total mass of the fluxed solder paste composition, from about 0.5% to about 50%.

* * * * *